United States Patent
Long et al.

[11] Patent Number: 5,847,390
[45] Date of Patent: *Dec. 8, 1998

[54] REDUCED STRESS ELECTRODE FOR FOCAL PLANE ARRAY OF THERMAL IMAGING SYSTEM AND METHOD

[75] Inventors: John P. Long, Garland; Donald A. Rogowski, Plano, both of Tex.

[73] Assignee: Texas Instruments Incorporated, Dalls, Tex.

[*] Notice: The term of this patent shall not extend beyond the expiration date of Pat. No. 5,757,000.

[21] Appl. No.: 838,663

[22] Filed: Apr. 9, 1997

Related U.S. Application Data

[60] Provisional application No. 60/015,037, Apr. 9, 1996.

[51] Int. Cl.$^6$ .................................................. G01J 5/02
[52] U.S. Cl. ................................. 250/332; 250/349
[58] Field of Search ............................. 250/338.3, 349, 250/332, 338.4, 370.08

[56] References Cited

U.S. PATENT DOCUMENTS

| | | |
|---|---|---|
| 4,678,536 | 7/1987 | Murayama et al. . |
| 4,705,593 | 11/1987 | Haigh et al. . |
| 4,871,416 | 10/1989 | Fukuda . |
| 4,926,051 | 5/1990 | Turnbull ................................. 250/332 |
| 5,030,827 | 7/1991 | Powell ............................. 250/338.3 X |
| 5,183,531 | 2/1993 | Terakado . |
| 5,238,529 | 8/1993 | Douglas . |
| 5,279,702 | 1/1994 | Douglas . |
| 5,312,516 | 5/1994 | Douglas et al. . |
| 5,374,330 | 12/1994 | Douglas . |
| 5,424,544 | 6/1995 | Shelton et al. . |
| 5,426,304 | 6/1995 | Belcher et al. . |
| 5,436,450 | 7/1995 | Belcher et al. . |
| 5,460,687 | 10/1995 | Douglas . |
| 5,603,848 | 2/1997 | Beratan et al. . |
| 5,608,254 | 3/1997 | Frank et al. ..................... 250/338.4 X |
| 5,638,599 | 6/1997 | Beratan et al. ..................... 250/332 X |

OTHER PUBLICATIONS

USSN 08/464,981 filed Jun. 5, 1995 entitled "Method for Etching Through a Substrate to an Attached Coating" by Howard R. Beratan, et al. (pending).

*Primary Examiner*—Edward J. Glick
*Attorney, Agent, or Firm*—Brian A. Carlson; James C. Kesterson; Richard L. Donaldson

[57] ABSTRACT

A focal plane array (30) for a thermal imaging system (20). The focal plane array (30) may include a number of thermal sensitive elements (42) bounded by a border (41). The thermal sensors (40) may provide a sensor signal output representative of the thermal radiation incident to the focal plane array (30). A multi-layer common electrode (36) may be coupled to the thermal sensitive elements (42) and the border (41). An optical coating (34) sensitive to infrared radiation may be provided in communication with the common electrode (36).

15 Claims, 1 Drawing Sheet

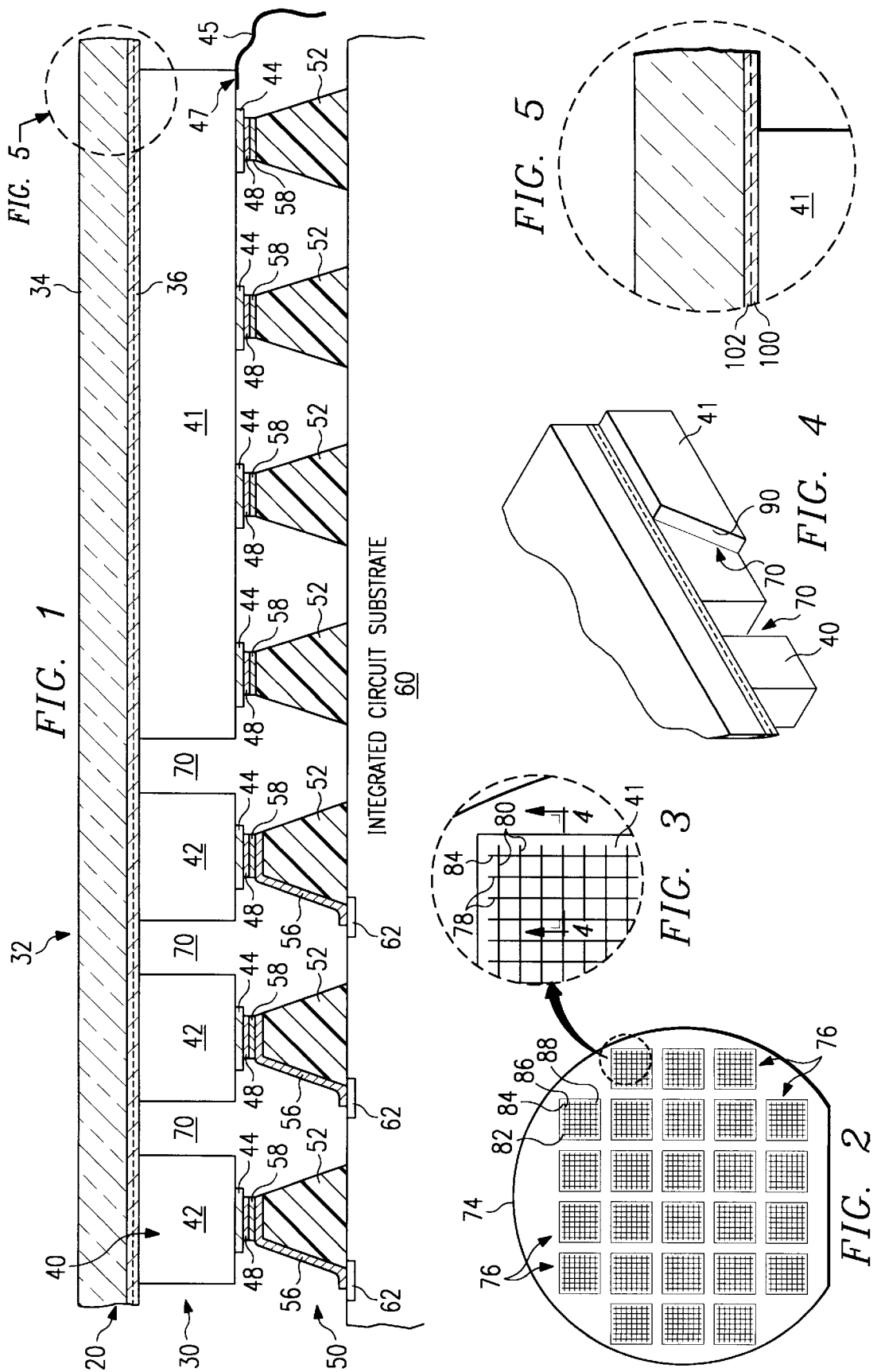

REDUCED STRESS ELECTRODE FOR FOCAL PLANE ARRAY OF THERMAL IMAGING SYSTEM AND METHOD

This application claims priority under 35 U.S.C. §119 (e) of provisional application No. 60/015,037, filed Apr. 9, 1996.

This application is related to copending U.S. patent application Ser. No. 08/842,933, filed Apr. 4, 1997, entitled "REDUCED STRESS FOCAL PLANE ARRAY FOR THERMAL IMAGING SYSTEM AND METHOD."

TECHNICAL FIELD OF THE INVENTION

This invention relates generally to imaging systems, and more particularly to a reduced stress electrode for focal plane arrays of thermal imaging systems and method.

BACKGROUND OF THE INVENTION

One common application for thermal sensors is in thermal (infrared) imaging device such as night vision equipment. One such class of thermal imaging devices includes a focal plane array of infrared detector elements or thermal sensors having pyroelectric material. The focal plane array and its associated thermal sensors are often coupled to an integrated circuit substrate with a corresponding array of contact pads and a thermal isolation structure disposed between the focal plane array and the integrated circuit substrate. The thermal sensors define the respective picture elements or pixels of the resulting thermal image.

One type of thermal sensor includes a thermal sensitive element formed from pyroelectric material which exhibits a state of electrical polarization and/or change in dielectric constant dependent upon temperature changes of the pyroelectric material in response to incident infrared radiation. An infrared absorber and common electrode assembly are often disposed on one side of the thermal sensitive elements. A sensor signal electrode is generally disposed on the opposite side of each thermal sensitive element. The infrared absorber and common electrode assembly typically extends across the surface of the focal plane array and is attached to the thermal sensitive elements. Each thermal sensitive element generally has its own separate sensor signal electrode. Each infrared detector element or thermal sensor may be defined in part by the infrared absorber and common electrode assembly and the respective sensor signal electrode. The common electrode and the sensor signal electrode constitute portion of capacitive plates. The pyroelectric material constitutes a dielectric or insulator disposed between the capacitive plates.

Typically, the thermal sensors of a focal plane array are bounded by a solid border formed from the same material as the thermal sensors. The border performs several functions including providing a conductive surface for attachment of a bias wire. The bias wire supplies a common voltage reference point for the focal plane array.

For some thermal sensors barium strontium titanate ($BaSrTiO_3$ hereinafter BST) may be used to form the thermal sensitive element for the resulting thermal sensors and the border. The starting place for fabricating such thermal sensitive elements is typically a wafer of barium strontium titanate or other suitable pyroelectric material having a diameter of four inches and an approximate thickness of 0.1 inches. Wafers of various sizes may be used as appropriate for each application. The thermal sensitive elements are generally framed by perpendicular cuts in the wafer. Thereafter, various grinding and/or polishing processes are frequently used to reduce the thickness of the BST wafer to approximately 0.001 inches or less.

A problem with such grinding and/or polishing processing, however, is that it tends to break or otherwise separate the common electrode at or near the inside edge of the border adjacent to the thermal sensitive elements. As a consequence, the border and attached portion of the common electrode may become separated from the remaining portion of the focal plane array. This prevents attachment of the bias wire to the focal plane array thereby rendering the array inoperable. Accordingly, there exists a need in the art for an improved electrode for a focal plane array of thermal imaging systems and method.

SUMMARY OF THE INVENTION

In accordance with the present invention, a focal plane array is provided that substantially eliminates or reduces the disadvantages and problems associated with prior thermal imaging systems.

In accordance with the present invention, a focal plane array for a thermal imaging system is provided. The focal plane array may comprise a number of thermal sensors bounded by a border. The thermal sensors may provide a sensor signal output representative of thermal radiation incident to the focal plane array. A multiple layer electrode may be coupled to the thermal sensors and to the border. An optical coating sensitive to infrared radiation may be provided in communication with the common electrode.

More specifically, the multi-layer electrode may include a first layer of material and a disparate second layer of material. The first layer may be a layer of tensile material and the second layer may be a layer of compressive material.

In accordance with another aspect of the present invention, a first and second series of divides or slots forming the thermal sensors may be provided. The first series of divides may include a leading first slot and a trailing first slot. A number of substantially parallel first slots may also be provided between the leading and trailing first slots. The second series of slots may include a leading second slot and a trailing second slot. A number of substantially parallel second slots may also be provided between the leading and trailing second slots. Each of the first slots may extend beyond the leading second slot and beyond the trailing second slot. Each of the second slots may extend beyond the leading first slot and beyond the trailing first slot.

Important technical advantages of the present invention include providing a reduced stress electrode for a focal plane array of a thermal imaging system. Another important technical advantage of the present invention includes providing a compressive common electrode. In particular, the common electrode may comprise a first layer of thin film material in tension and a disparate second layer of thin film material in compression. The combination of a compressive layer and a tensile layer results in a common electrode better able to withstand the strain of fabricating the resulting focal plane array.

Other technical advantages of the present invention will be readily apparent to one skilled in the art from the following figures, descriptions and claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is a schematic representation in elevation and in section with portions broken away of a thermal imaging system having a focal plane array and an integrated circuit substrate with a thermal isolation structure disposed therebetween;

FIG. 2 is a plan view of a wafer having a number of thermal sensor array formed therein in accordance with the present invention;

FIG. 3 is an enlarged, detailed view of a thermal sensor array of FIG. 2;

FIG. 4 is a schematic drawing in perspective taken along lines 4—4 of FIG. 3 showing a slot extended in the border; and FIG. 5 is a detailed schematic view of the infrared absorber assembly and common electrode of FIG. 1.

DETAILED DESCRIPTION OF THE INVENTION

The embodiments of the present invention and its advantages are best understood by referring to FIGS. 1 through 5 of the drawings, like numerals being used for like and corresponding parts of the various drawings.

Some infrared detectors and thermal imaging systems are based upon either the generation of a change in voltage due to a change in temperature resulting from incident infrared radiation striking a thermal sensor or the generation of a change in voltage due to a photon-electron interaction within the material used to form the thermal sensor. This latter effect is sometimes called the internal photoelectric effect. Other infrared detectors and thermal imaging systems are based upon the change in resistance of a thin conductor caused by the heating effect of incident infrared radiation. Such infrared detectors are sometimes referred to as bolometers.

Thermal imaging systems constructed in accordance with the teachings of the present invention preferably function based upon the generation of a change in voltage due to a change in temperature of pyroelectric material resulting from incident infrared radiation. However, the present invention may be used with other types of thermal imaging systems including bolometers.

Thermal imaging system or infrared detector 20, which will be described later in more detail, may be referred to as an uncooled infrared detector. The various components of thermal imaging system 20 are preferably contained within an associated housing (not shown) in a vacuum environment. Alternatively an environment of low thermal conductivity gas may be satisfactory for some applications.

Thermal imaging system 20 may be described as a solid state system formed by mounting focal plane array 30 with thermal isolation structure 50 on integrated circuit substrate 60. Focal plane array 30 preferably includes a plurality of thermal sensors 40. Focal plane array 30 may be both electrically and mechanically coupled with integrated circuit substrate 60 by thermal isolation structure 50 to produce a thermal image in response to incident infrared radiation striking focal plane array 30.

The components of focal plane array 30 include infrared absorber and common electrode assembly 32 and a plurality of thermal sensors 40 formed in part by a M×N array of thermal sensitive elements 42 bounded by a border 41. Infrared absorber and common electrode assembly 32 may further comprise one or more layers of optical coating 34 forming a tuned cavity from dielectric material such as parylene or zirconium oxide ($ZrO_2$). For some applications layer 34 may include multiple layers depending upon the specific wavelength or wavelengths of infrared radiation that thermal sensors 40 are designed to detect. Additionally, as described in detail below, the common electrode 36 may be constructed of multiple layers of different materials.

Each thermal sensor 40 may include a respective thermal sensitive element 42 which is preferably formed from pyroelectric material. The border 41 is preferably formed from the same pyroelectric material. One side of each thermal sensitive element 42 and of the border 41 is preferably attached to common electrode 36. Sensor signal electrodes 44 are attached to the opposite side of respective thermal sensitive elements 42 and the border 41. For some applications thermal sensitive elements 42 and the border 41 may be formed from pyroelectric material such as barium strontium titanate (BST).

A bias wire 45 may be attached to the border 41. The bias wire 45 may be attached to the border 41 with bump bonding techniques that are described in detail below. The bias wire 45 provides a common reference voltage at point 47 extending across common electrode 36 of focal plane array 30. A far end of the bias wire 45 is preferably attached to the integrated circuit substrate 60. If border 41 is not properly coupled to common electrode 36 or if there are breaks or discontinuities in either border 41 or common electrode 36, a uniform reference voltage may not be supplied to each thermal sensor 40. For some applications a break in border 41 may prevent proper attachment of bias wire 45. As a result, the focal plane array 30 will not operate satisfactorily without rework that is generally time consuming, costly and may not be successful.

Thermal isolation structure 50 includes a number of mesa-type structures 52 disposed on integrated circuit substrate 60 adjacent to respective contact pads 62. Thermal isolation structure 50 may be used to provide mechanical support during bonding of focal plane array 30 with integrated circuit substrate 60 and to thermally insulate focal plane array 30 from integrated circuit substrate 60. Thermal isolation structure 50 provides an electrical interface between each thermal sensor 40 in focal plane array 30 and integrated circuit substrate 60. Also, thermal isolation structure 50 provides mechanical support for border 41. The electrical interface allows integrated circuit substrate 60 to process signals based on incident infrared radiation detected by focal plane array 30.

Mesa strip conductor 56 provides a signal path between the top of each mesa-type structure 52 and the adjacent contact pad 62. Because the border 41 is not employed as a thermal sensitive element, no mesa strip conductors 56 are provided for mesa-type structures 52 which support border 41. Recommended materials for the mesa strip conductors 56 include nickel chrome (NiCr) and titanium and tungsten alloys as well as other conductive oxides.

Various types of semiconductor materials and integrated circuit substrates may be satisfactorily used with the present invention. U.S. Pat. No. 4,143,269 entitled Ferroelectric Imaging System provides information concerning infrared detectors fabricated from pyroelectric materials and a silicon switching matrix or integrated circuit substrate. Examples of previous thermal isolation structures are shown in U.S. Pat. No. 5,047,644 entitled Polyimide Thermal Isolation Mesa for a Thermal Imaging System to Meissner, et al. The fabrication techniques and the materials used in U.S. Pat. No. 5,047,644 may be used in fabricating thermal isolation structure 50.

Bump bonding techniques may be satisfactorily used to form metal bonds between focal plane array 30 and thermal isolation structure 50. For one embodiment of the present invention, bump bonding material 48 may be placed on each sensor signal electrode 44 and bump bonding material 58 may be placed on the top of each mesa strip conductor 56. Indium is one example of such bump bonding material.

The configuration of mesa-type structures 52 and the associated mesa strip conductors 56 are design choices, largely dependent upon thermal isolation and structural rigidity considerations. Alternative configurations for mesa-type structures 52 include mesas with sloping sidewalls and mesas with vertical sidewalls. Mesa-type structures 52 of the present invention, including the exemplary thermal isolation structure 50, for thermal imaging systems 20 and 120, may be fabricated using conventional photolithographic techniques.

A significant feature of the present invention is the construction of a number of slots 70 that form thermal sensor 40 and define the border 41. As used herein, the term "slots" means a void, empty or filled space, or other type of divide between neighboring elements. Thermal sensitive element 42 may be formed by a series of cuts in a wafer 74 to provide the desired M×N array. As previously noted, wafer 74 may be formed from various types of pyroelectric and/or bolometric material. Wafer 74 preferably has dimensions associated with four, six, or eight inch disks or wafers compatible with fabrication techniques for very large scale integrated circuits.

FIG. 2 illustrates the wafer 74 having a series of cuts therein to form a number of thermal sensor arrays 76. Each thermal sensor array 76 comprises the array of thermal sensitive elements 42 within border 41. The wafer 74 may have an initial approximate thickness of 0.1 inches. The cuts may be made to a depth of about 25 microns in the wafer 74. The cuts may be made by laser reticulation, ion milling reticulation, or the like. Precision laser and ion milling equipment for use in connection with fabrication of thermal sensors is typically computer controlled for accuracy. Such equipment is well known in the art and will not be further described herein.

FIG. 3 illustrates a detailed view of a thermal sensor array 76. In accordance with one aspect of the present invention, each thermal sensor array 76 may comprise a first series of slots 78 and a second series of slots 80. The first and second series of slots may be substantially perpendicular to form substantially square thermal sensitive elements 42. The first series of slots 78 may include a leading first slot 82 and a trailing first slot 84. A number of substantially parallel first slots may be included between the leading and trailing first slots. The second series of slots 80 may include a leading second slot 86 and a trailing second slot 88. A number of substantially parallel second slots may be provided between the leading and trailing second slots.

Each of the first slots 78 may extend beyond the leading second slot 86 and beyond the trailing second slot 88. Additionally, each of the second slots 80 may extend beyond the leading first slot 82 and beyond the trailing first slot 84. FIG. 4 is a perspective view illustrating the extension of a slot into the border 41. This extension of the slot 70 into the border 41 establishes a gradual stress field throughout the border 41. During the fabrication process, parylene or similar filler materials may be used to fill the divides to further reduce stress particularly within the border.

As shown by FIG. 4, the ends 90 of the slots 70 may be tapered. The tapered end provides a more gradual stress field throughout the border 41. It will be understood, however, that the edges 90 of the slots 70 may be squared or otherwise shaped within the scope of the present invention.

Accordingly, the present invention provides a focal plane array 30 that can better withstand the strain of the fabrication process processing. In particular, the border 41 and the attached portion of the infrared absorber and common electrode assembly 32 are less likely to become separated from the focal plane array 30.

Moreover, because the extended slots and the wafer 74 using the slots 70 of the present invention may be fabricated using conventional cutting equipment, no new or otherwise special equipment other than that already used for forming thermal sensors needs to be employed to produce the extended slots 70 of the present invention.

AS previously discussed, the wafer 74 may be a BST wafer. In accordance with conventional practice, preparation of a BST wafer 74 for processing and use in accordance with the present invention may begin with a batch liquid mixing operation. Constant mix action and careful component measurement should be observed. The BST ceramic fabrication portion of the process ends with a polished BST wafer 74.

The slots 70 may be formed and extended into the border 41 in accordance with the present invention during the reticulation process. Reticulation of the BST wafer 74 may be accomplished using a laser based process, ion milling reticulation or the like. After laser processing, a wet etch may be used to remove the slag and an anneal used to re-oxidize the material to avoid electrical leakage. Ion milling reticulation may improve producibility due to a more complete semiconductor process compatibility. For example, reduction of BST pixel thickness to 10–12 microns and additional improvements in a thermal isolation structure may allow for higher performing arrays at lower overall cost than the laser reticulation process.

Once the reticulation process is complete, the annealed BST wafer 74 may proceed into a chemical vapor deposition process for deposit a backfill into the grooves. The backfill may be parylene, other polymer coating, or other type of filler material compatible with wafer fabrication. A polishing operation may then be used to replanarize the surface of the wafer prior to application of the common electrode and the optical coating. The replanarization operation removes the filler material from the top of the wafer 74, but leaves the filler material in the slots 70.

The parylene or other filler material reduces stress within the border by providing a structure that extends throughout the slots 70 and into the border 41. Accordingly, the present invention provides a wafer that is less likely to break during processing.

The common electrode 36 and the optical coating 34 may then be deposited onto the wafer 74. The filler material supports the common electrode 36 and optical coating 34 during the deposition process. After the optical coating 34 has been deposited, the wafer 34 may be mounted onto a glass plate and the wafer is thinned to the desired thickness of the thermal sensors. The wafer may be thinned by grinding and/or polishing operations. As previously described, bonding materials may then be deposited to form metal bonds between focal plane array 30 and thermal isolation structure 50. The filler material may then be removed by etching.

Another significant feature of the present invention is the construction of the common electrode 36. In accordance with the present invention, the common electrode 36 is preferably a thin film layer which is either stress neutral or slightly compressive.

In one embodiment of the present invention, the common electrode 36 may be fabricated of two or more thin film layers. FIG. 5 illustrates a two layer common electrode 36. The two layer common electrode 36 may comprise a first layer of tensile material 100 and a second layer of compression material 102. It will be understood by those skilled in the art, however, that a stress neutral or slightly compressive common electrode 36 may include more than two layers within the scope of the present invention. For example, in some applications common electrode 36 may be formed from three or more thin film layers of different material. The use of thin film layers of different material may strengthen the common electrode 36 and thereby allow the overall thickness of the common electrode to be reduced. The thinner common electrode 36 reduces the conductance between pixels associated with the thermal sensors 40 and thus the cross talk between pixels.

The material first layer 100 may be a tensile material such as nickel chrome, ruthenium (Ru), ruthenium oxide ($RuO_2$), lanthanum strontium cobalt oxide (LSCO) or platinum which have appropriate values of thermal and electrical conductivity. The reflectivity of such materials also cooperates with optical coating 34 to enhance the absorption of incident infrared radiation. For other embodiments of the present invention, tensile materials other than metal which have the desired characteristics of electrical and thermal conductivity may be used to form a second layer 100 of the common electrode 36. Accordingly, the present invention is not limited to using only metal for the common electrode 36.

The material of second layer 102 may be a compressive material such as tungsten titanium (TiW). The compressive material of the second layer 102 changes the characteristics of the common electrode 36 from tensile stress to stress neutral or slightly compressive, depending on the compressive material used and the thickness of that layer.

In a particular two layer embodiment, the first layer of material 100 may comprise a layer of nickel chrome. The second layer of material 102 may comprise a layer of tungsten titanium. Preferably in this embodiment, the nickel chrome layer may have a thickness of approximately 400 angstroms. The tungsten titanium layer may have a thickness of approximately 200 angstroms. Together, the nickel chrome and the tungsten titanium layers form a slightly compressive common electrode 36.

The stress neutral or slightly compressive characteristic of the common electrode 36 reduces stress throughout the focal plane array 30. Accordingly, the present invention provides a focal plane array that can better withstand the strain of fabrication processing. In particular, the common electrode 36 is not under tensile stress that biases the orientation of the thermal sensitive elements 42 and the border 41. As a result, the border 41 and the portion of the common electrode 36 attached to the border is unlikely to become separated from the focal plane array 30.

In accordance with conventional practice, the common electrode 36 may be fabricated with a sputter machine. The 400 angstrom thick layer of nickel chrome may sputter deposited in successive passes of 200 angstroms each. The tungsten titanium layer may be sputter deposited in a single pass of 200 angstroms. This allows the sputter system to be set for a single target depth for the disparate materials of the common electrode 36. Such sputter machines are well known in the art and will not be further described herein.

The stress neutral or a slightly compressive property of the common electrode 36 reduces the stress of the common electrode 36. As a result, the common electrode 36 may be thinner than was previously operable. As previously discussed, the thinner common electrode 36 reduces the conductance between pixels associated with the thermal sensors 40 and thus the cross talk between pixels. Accordingly, the common electrode 36 of the present invention provides greater resolution for the thermal imaging system 20.

The extended slots 70 and multiple layer common electrode 36 of the present invention may be used together in the focal plane array 30 to maximize the reduction and distribution of stress throughout the focal plane array 30. However, it will be understood by those skilled in the art that the present invention encompasses using the extended slots 70 or the multiple layer common electrode 36 features independently.

Although the present invention and its advantages have been described in detail, it should be understood that various changes, substitutions and alterations can be made therein without departing from the spirit and scope of the invention as defined by the appended claims.

What is claimed is:

1. A focal plane array for a thermal imaging system, comprising:
    a number of thermal sensors formed by an array of thermal sensitive elements bounded by a border;
    the thermal sensors providing a sensor signal output representative of thermal radiation incident to said focal plane array;
    a multiple layer common electrode comprising a first layer in tension and a disparate second layer in compression, said electrode coupled to each thermal sensitive element and to the border; and
    a optical coating sensitive to infrared radiation disposed on the common electrode opposite from said thermal sensitive elements.

2. The focal plane array of claim 1, the focal plane array further comprising a two layer common electrode.

3. The focal plane array of claim 1, the multiple layer common electrode further comprising a first layer of material and a disparate second layer of material.

4. The focal plane array of claim 1, further comprising a bias wire connected to the border to provide a common reference voltage for said focal plane array.

5. The focal plane array of claim 1, further comprising:
    a first and second series of slots forming the thermal sensitive elements;
    the first series of slots including a leading first slot, a trailing first slot, and a number of substantially parallel first slots therebetween;
    the second series of slots including a leading second slot, a trailing second slot, and a number of substantially parallel second slots therebetween;
    each of the first slots extending beyond the leading second slot and beyond the trailing second slot; and
    each of the second slots extending beyond the leading first slot and beyond the trailing first slot.

6. The focal plane array of claim 5, each slot further comprising a pair of ends, each end being tapered.

7. The focal plane array of claim 5, further comprising the first and second slots being substantially perpendicular with respect to each other.

8. A thermal detector including a focal plane array mounted with a thermal isolation structure on an integrated circuit substrate, comprising:
    a number of thermal sensors formed by an array of thermal sensitive elements bounded by a border;
    the thermal sensors providing a sensor signal output representative of thermal radiation incident to said focal plane array;

a common electrode comprising a first layer in tension and a disparate second layer in compression, said electrode coupled to the thermal sensitive elements and to the border;

a optical coating sensitive to infrared radiation disposed on the common electrode opposite from said thermal sensitive elements;

said thermal isolation structure disposed between said focal plane array and said integrated circuit substrate, said thermal isolation structure projecting from said integrated circuit substrate for mounting said focal plane array to said integrated circuit substrate; and a number of contact pads disposed on said integrated circuit substrate for receiving the sensor signal output from the thermal sensors through said thermal isolation structure.

9. The focal plane array of claim 8, the common electrode further comprising a first layer of nickel chrome and a disparate second layer of titanium tungsten.

10. The thermal detector of claim 8, further comprising a bias wire connected to the border to provide a common voltage point for said focal plane array.

11. The thermal detector of claim 8, further comprising:

a first and second series of slots forming the thermal sensors;

the first series of slots including a leading first slot, a trailing first slot, and a number of substantially parallel first slots therebetween;

the second series of slots including a leading second slot, a trailing second slot, and a number of substantially parallel second slots therebetween;

each of the first slots extending beyond the leading second slot and beyond the trailing second slot; and each of the second slots extending beyond the leading first slot and beyond the trailing first slot.

12. The thermal detector of claim 11, each slot further comprising:

a pair of ends, each end being tapered; and the first and second slots being substantially perpendicular.

13. The thermal detector of claim 8, the common electrode further comprising a thickness of about 800 angstroms or less.

14. The thermal detector of claim 8, the common electrode further comprising a thickness of 800 angstroms or less.

15. A method of fabricating a focal plane array for a thermal imaging system, comprising the steps of:

forming an array of thermal sensitive elements bounded by a border from a wafer of thermal sensitive material;

forming a first layer of a common electrode in tension and on one side of the thermal sensitive elements and the border; and forming a second layer of the common electrode in compression and on the first layer of the common electrode opposite from the array of thermal sensitive elements and the border.

* * * * *